March 4, 1969 A. GEE 3,430,335

METHOD OF TREATING SEMICONDUCTOR DEVICES OR COMPONENTS

Filed June 8, 1965 Sheet 1 of 2

Allen Gee,
INVENTOR.

BY.

ATTORNEY.

Allen Gee,
INVENTOR.
BY.
W. McAllister Jr
ATTORNEY.

United States Patent Office 3,430,335

Patented Mar. 4, 1969

3,430,335

METHOD OF TREATING SEMICONDUCTOR DEVICES OR COMPONENTS

Allen Gee, Newport Beach, Calif., assignor to Hughes Aircraft Company, Culver City, Calif., a corporation of Delaware Filed June 8, 1965, Ser. No. 462,357
U.S. Cl. 29—588 6 Claims
Int. Cl. H01l 1/10, 7/24, 7/34

ABSTRACT OF THE DISCLOSURE

Method of preventing or reducing high-voltage high-temperature breakdown in glass packaged oxide-protected diffused junction diodes in which either or both the glass package or the diode is exposed to the vapor of phosphorus pentoxide or arsenic trioxide or phosphorus oxychloride at elevated temperature.

This invention relates to semiconductor devices and especially to junction-type silicon diodes. More particularly, the invention relates to methods of manufacturing and treating diffused junction-type silicon diodes so as to improve and stabilize their electrical characteristics.

Diffused junction-type silicon diodes comprising a body of N-type silicon having a P-type conductivity region formed in one surface thereof by diffusion of a P-type impurity through a silicon oxide mask are well known. It is also well known to leave the oxide mask in situ on the surface of the silicon body, except for an opening in the mask to permit electrical connection to the diffused region, so as to protect this surface and especially the P-N rectifying junction which terminates at this surface. While the silicon oxide mask is efficacious in protecting the device thus formed and is in many applications as in microcircuitry or integrated circuit arrangements the only protection needed, there are other applications where additional protection against mechanical damage or detrimental environments is needed. In order to achieve such additional protection, a silicon junction diode such as briefly described above has been marketed in a hermetically sealed package comprising a small tubular glass envelope and a pair of metallic end caps. Electrical connections between the diode and the end caps are achieved by contacting or bonding the silicon body on the inside surface of one of the end caps and by contacting or bonding the contact from the diffused junction-forming region in the silicon body to the inside surface of the other end cap.

For some reason not as yet clearly understood, it has been found that the oxide-protected and packaged diffused silicon diode just described is subject to breakdown when operated with a reverse voltage of the order of 50 volts in a temperature range from 90° to 200° C. It is suspected that, under these conditions, ions from the package body glass or from a layer of glass which is sometimes deposited over the oxide on the silicon body migrate through the oxide and cause an electrical shunt of the rectifying junction where it terminates at the surface of the silicon body. It has been noted also that unpackaged and uncoated but oxide-protected diodes of this type do not exhibit such breakdown at the aforementioned reverse voltage and temperature. The present invention therefore relates to a treating process for such packaged and coated diodes which renders them immune to the aforesaid high-temperature, high-voltage breakdown after packaging.

It is therefore an object of the invention to provide an improved method for treating glass-packaged oxide-protected diffused junction semiconductor diodes.

Another object of the invention is to provide an improved treatment for preventing and/or reducing high-voltage, high-temperature degradation in glass-packaged oxide-protected diffused junction silicon diodes.

These and other objects and advantages of the invention are realized by heating and exposing the glass body package and/or the oxide-protected semiconductor device such as a diode to the vapors of phosphorus pentoxide ($P_2O_5$ or $P_4O_{10}$) or arsenic trioxide ($As_2O_3$ or $As_4O_6$) or phosphorus oxychloride ($POCl_3$). A marked reduction in the temperature-voltage degradation characteristic of diffused junction, oxide-protected devices has been obtained by treating either the oxide-protected device alone or the glass package body alone or by treating both. During exposure to the aforementioned vapors, the part being treated is maintained at an elevated temperature as will be described more fully hereinafter.

The invention will be described in greater detail by reference to the drawings in which.

Figures 3, 4, 5, 6:
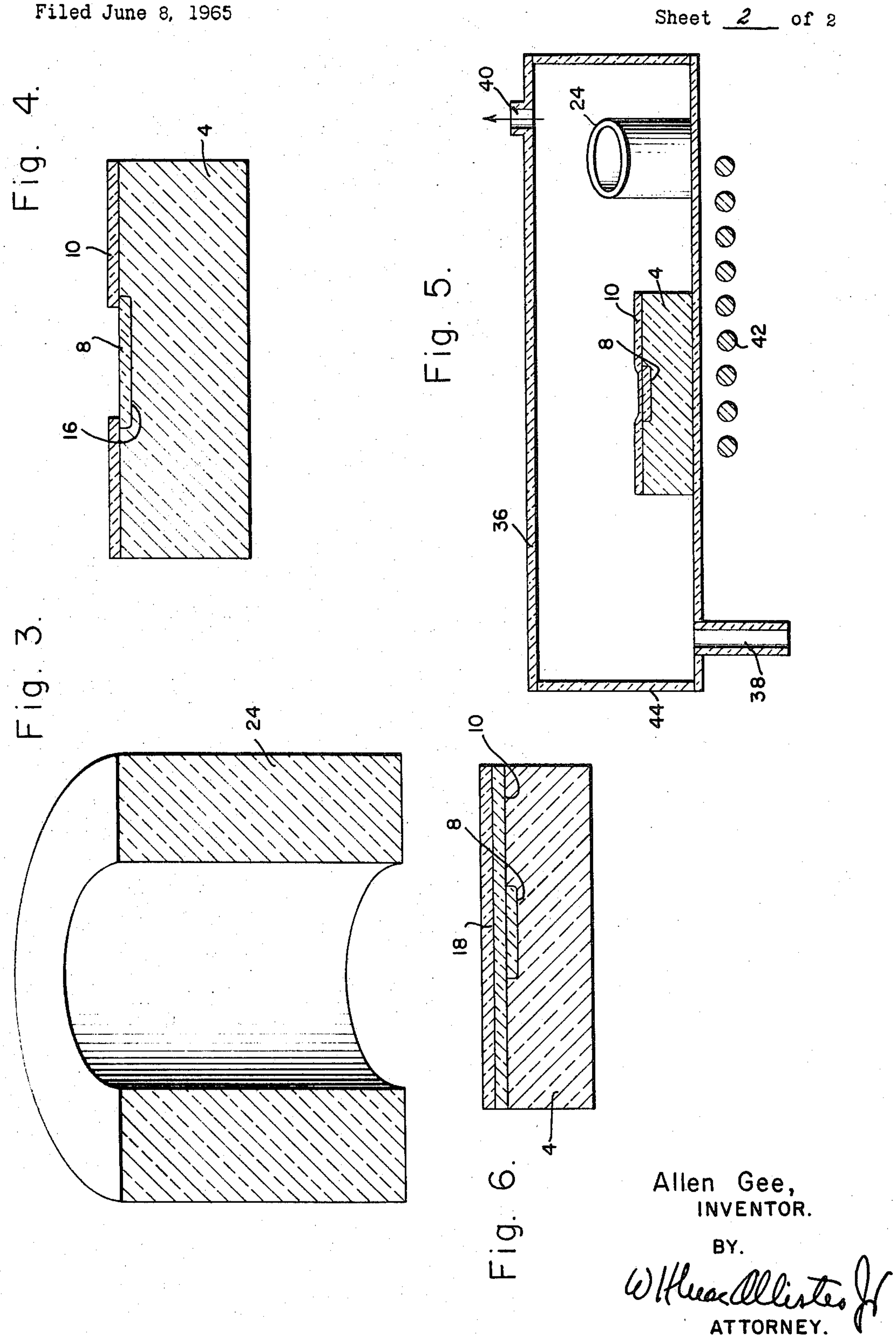
FIGURE 3 is a perspective view partly in section of the glass body portion prior to assembly as part of the package of the diode device shown in FIGURES 1 and 2.
FIGURE 4 is a cross-sectional elevational view of a diode device at one stage in the fabrication thereof.

FIGURE 5 is a partly schematic, partly cross-sectional view in elevation of apparatus for treating the diode device of FIGURE 4 or the glass body portion of the package therefor shown in FIGURE 3 in accordance with the practice of the present invention; and FIGURE 6 is a cross-sectional elevational view of a diode device at a further stage in the fabrication thereof and after treatment thereof according to the present invention.

Referring now to the drawings, a typical semiconductor diode device is shown completely packaged and processed according to the invention. The diode device 2 may comprise, for example, a silicon crystal member 4, the bulk of which may be of N-type conductivity. The "back" surface of the silicon member or die 4 may be provided with a gold-silicon eutectic layer 6 by previous processing, as is well known in the art of semiconductor device fabrication, in order to insure a good ohmic connection to the N-type semiconductor die 4. The gold-silicon eutectic layer 6 may be provided by evaporating a thin layer of gold onto the back surface of the silicon body while maintaining this body at the gold-silicon eutectic temperature. Thereafter, by conventional techniques, a thin layer 7 of silver may be electroplated over the gold-silicon layer 6.

The remainder of the diode device 2 comprises a diffused P-type junction-forming region 8 disposed on an upper surface of the semiconductor die 4 with protective non-conductive coatings 10 and 18 disposed over portions thereof including especially those portions where the junction 16 between the P-type region 8 and the bulk of the N-type body 4 extends to the surface of the semiconductor die. This junction-forming P-type region 8 is formed prior to assembly of the device 2 in the package by masking the upper surface of the silicon die 4 to form a non-conductive coating 10 as by oxidizing this surface. A portion of this coating may then be removed, as by etching, to form an opening or window therein as shown in FIGURE 4. Thereafter the thus masked surface of the semiconductor die is exposed to a diffusion atmosphere containing in vapor form a P-type impurity such as boron, for example. By the process of diffusion, the impurity establishes the P-type region 8 through the opening in the mask. The P–N rectifying junction 16 is thus formed under the protective oxide layer 10 which is left in situ. This process is well known in the art and is fully described in U.S. Patents 2,802,760 to Derick and Frosch and 3,025,589 to Hoerni.

Electrical contact to the P-type region 8 is provided by means of a metal fill or "bump" 12 through openings provided in the non-conductive coatings 10 and 18. Semiconductor devices such as shown are extremely small, the area of the surface of the die member 4 containing the junction-forming region 8 being about 400 sq. mils. In such a device, it is customary that the opening in the non-conductive mask coatings 10 and 18 be only about 3.5 mils in diameter. Electrical connection to the exposed surface of the die member through the window in the non-conductive coatings 10 and 18 is provided by electroplating.

While a single such device may be fabricated on a discrete semiconductor body or die, it has been found more convenient and economical to perform the required fabrication processes on a large wafer of semiconductor material and form a plurality of rectifying junction devices simultaneously and thereafter "dice" the wafer to obtain separate devices or dice. Thus it should be understood that, though the process of the invention is described as being performed on a discrete semiconductor body or die, the practice is by no means limited thereto.

The package or container for the device just described comprises a pair of opposed terminal cap members 20 and 22 sealed together at their peripheries by means of a glass body portion or envelope 24 with the semiconductor device 2 therewithin and therebetween. The cap members 20 and 22 are of metal and are each provided with centrally disposed mesa or pedestal portions 26 and 28, respectively.

Figure 1:
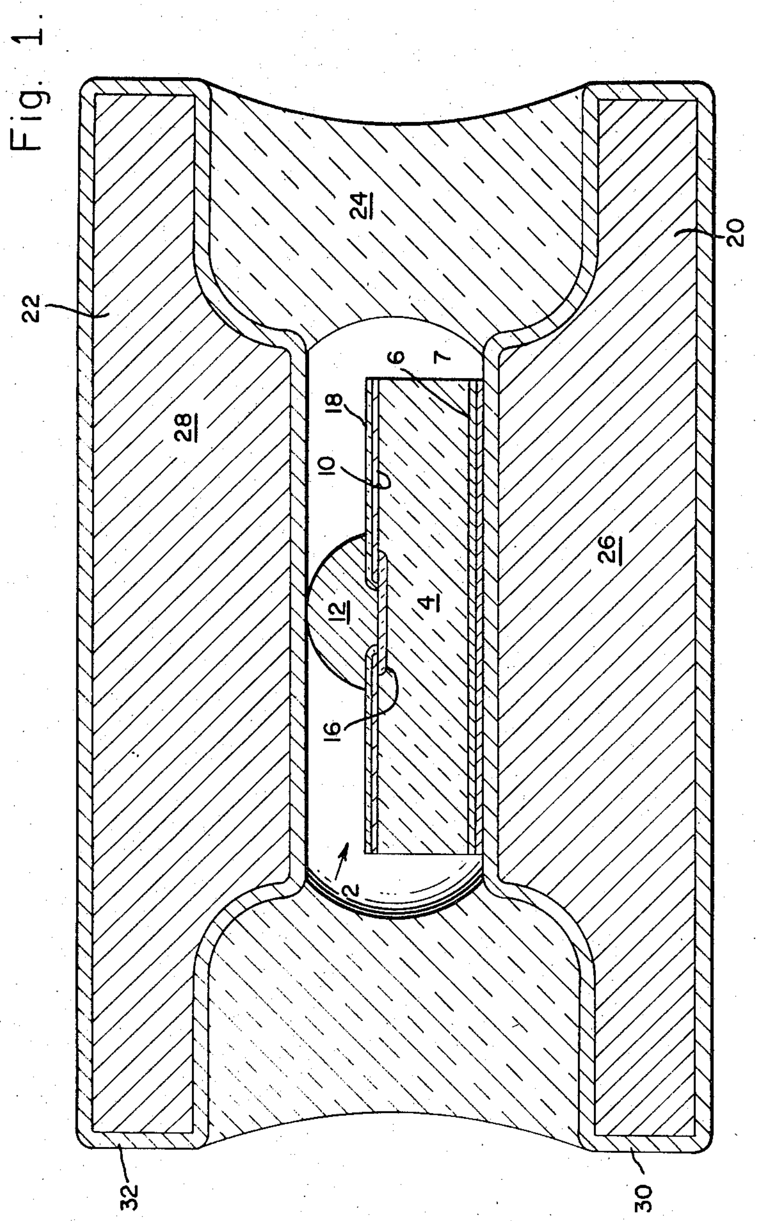
FIGURE 1 is a cross-sectional elevational view of a typical diode device mounted in an hermetic glass package and treated according to the practice of the present invention.

A suitable glass for the package shown in FIGURE 1 may be a high lead glass identified as "Glass Code 8870" by Corning Glass Works of Corning, N.Y. the manufacturer thereof. The metallic end cap members 20 and 22 may be formed of a glass-sealing metal consisting essentially of an alloy of iron and nickel in equal proportions by weight. During the heating of the glass body 24 in contact with such an alloy element, however, the cap members tend to readily oxidize which would severely reduce the ability to achieve metal-to-metal bonds or soldering action to such end cap members. It has been found advantageous to plate these end cap members with silver so as to inhibit or avoid the deleterious effects of such oxidation of the metal of these cap members while at the same time achieving excellent sealing of the glass body part to these cap members. In addition, the silver plating readily bonds with the metals forming the contact portions or connections on the semiconductor device 2. As shown in the drawings, the end cap members 20 and 22 are provided with platings 30 and 32 by conventional silver electroplating techniques over their entire surfaces which plating may be about 0.0007" in thickness.

The package assembly shown in the drawing is achieved by placing the silicon semiconductor device 2 on the pedestal portion 26 of an end cap member 20 with the silver-plated layer 7 of the semiconductor device 2 being in contact with the silver layer 30 on the mesa portion 26 of the cap member 20. The ringlike glass part 24 is then placed on the peripheral portions of the cap member 20 and the upper cap member 22 is placed with its pedestal portion 28 extending downwardly within the glass member 24. The assembly is then placed in an oven or any other desired heating apparatus and raised to a temperature at which the glass body 24 softens and seals to the metallic cap members 20 and 22. During this sealing operation the glass body 24 loses its heretofore substantially symmetrical, cylindrical shape and tends to slump down to assume more or less the shape shown in the drawing. This slumping down of the glass body 24 permits the upper cap member 22 to drop downwards toward the lower cap member 20 so that the silver-plated pedestal 28 of the upper cap membre 22 contacts and bonds to the metal button or "bump" element 12 on the semiconductor device 2. To enhance this action and to ensure that the upper cap member does in fact come down sufficiently to ensure contact to the metal connector 12, it may be desirable to place a weight on the assembly during this heating operation.

Utilizing metal cap members of the aforementioned alloy and a glass body 24 of Corning Glass Number 8870, an hermetically sealed package may be obtained and bonded connections provided between the upper cap member 22 to the connector element 12 and between the lower cap member 20 and the back surface 6 of the semiconductor device by heating the assembly to about 710° C. for three to five minutes.

Figure 2:
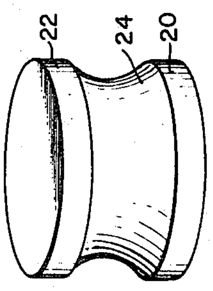
FIGURE 2 is an over-all perspective view of the packaged diode device shown in FIGURE 1.

Prior to mounting and sealing semiconductor devices in the package just described and shown in FIGURES 1 and 2, the devices are electrically tested and it has been found that almost all devices tested at this stage are capable of operating at a temperature of 200° C. with a reverse voltage of 50 volts or more without degradation. The device at this test stage comprises the silicon body 4, the junction-forming region 8, and an oxide-protected surface 10 with the metal contact 12 bonded to the junction-forming region 8 through an opening in the oxide mask 10. Immediately after mounting and sealing such devices in the package shown and described, a severe degradation in the electrical properties is noted for a substantial number of devices. Such diodes especially fail to operate and degrade under the high temperature-high voltage conditions described previously. The reason for such behavior is not known at this time. By the process of the present invention, however, it has been unexpectedly found that such failure may be entirely eliminated or substantially reduced to the point where manufacture of such devices is economically feasible. This improvement in the electrical characteristics of oxide-protected silicon devices of the diffused junction type is achieved by subjecting the oxide-protected surface of the device 2 or the body glass member 24 of the package, or both, to the vapors of phosphorus pentoxide, or arsenic trioxide or phosphorus oxychloride at an elevated temperature for a few minutes. The reason for the "cure" is not fully understood.

*Treating the glass package body*

In order to practice the process of the invention on the glass body portion 24, this portion of the package as shown in FIGURE 3 is placed in a reaction vessel 36 as shown in FIGURE 5, for example. The reaction vessel 36 may be formed of quartz or the like and is provided with removable end-portion of stopper 44 in order to permit the loading and unloading of parts to be treated. The reaction vessel 36 also includes an entry port 38 and an exit port 40 so that gases or vapors may be introduced at one end of the vessl and caused to flow through the vessel and in contact with the parts to be treated and then escape through the exit port 40. The reaction vessel 36 is also adapted to be heated to any desired temperature by the electrical heater elements 42. It will be readily understood that the vessel 36 and the parts to be treated therein as shown in FIGURE 5 are not to scale and are exemplary only. Actually a large number of parts would be treated simultaneously by the process of the present invention.

In treating the glass body parts 24 these parts are placed in the reaction vessel 36 whose loading end is then stopped by the end piece 44. The electrical heating elements 42 are then energized until the temperature of the glass body parts 24 is elevated to about 400° to 500° C. Phosphorus pentoxide vapor, or one of the other vapor materials mentioned previously, is then introduced into the reaction vessel 36 through the entry port 38 (which is connected to any convenient vapor source). The heated glass body parts 24 are subjected to this vapor for several minutes it being preferred to permit such treatment to proceed for about ten minutes in order to insure complete exposure of the part to the vapor. Thereafter the glass body parts 24 are removed from the reaction vessel for assembly in the package arrangement as shown and described previously.

*Treating the semiconductor device*

In treating the semiconductor devices according to the process of the present invention, the devices 2 are placed in the reaction vessel 36 after the diffusion step described in connection with FIGURE 4 has been carried out and after the opening in the oxide layer 10 has been closed by oxidation of the exposed surface therethrough. The device 2 will then be in the stage of fabrication as shown in FIGURE 5. That is, treatment according to the present invention is practiced on a semiconductor device having a junction-forming diffused region 8 in at least one surface of the semiconductor body 4 which surface is completely covered with an oxide layer 10. The heater elements 42 are then energized as necessary to elevate the temperature of the semiconductor device 2 to about 500° C. at which point one of the aforementioned vapors is introduced into the reaction vessel 36 as described previously. The device is subjected to this vapor for several minutes and at this temperature, it being preferred to maintain such treatment for at least ten minutes in order to insure complete exposure of the device to the vapor.

Thereafter the thus-treated device 2 may be removed to a second reaction vessel or allowed to remain in the reaction vessel 36 for further processing which may be accomplished simply by establishing a different atmosphere therewithin. Specifically, it is desired to pyrolytically form a second oxide layer 18 over the first oxide layer 10 after the foregoing treatment has been accomplished. This additional oxide layer 18 may be formed by pyrolytically decomposing tetraethylmethoxy silane, for example. Such an additional oxide layer may thus be formed by raising the temperature of the reaction vessel 36 to about 650° C. to 1000° C. depending upon the decomposition temperature of the oxide-forming material to be used. Alternatively, the oxide coating 18 may be formed by thermally cracking or decomposing the oxide-forming material in a separate reaction vessel and then supplied to the reaction vessel 36 for application to the semiconductor device 2 therein. This permits maintaining the semiconductor device at some preferred lower temperature in order to form the additional oxide layer 18 thereon. This lower temperature, which may be 300° C. in a typical case, may be desired in order to avoid excessive heating of the semiconductor device which might adversely affect its electrical characteristics.

After this treatment, the semiconductor device 2 is then processed as described previously. Thus, an opening is formed through the oxide layers 10 and 18 to expose a portion of the junction-forming region 8 and the metal contact 12 for the region 8 may be formed as previously described. In addition, the back or reverse surface of the semiconductor device may be supplied with metallic layers 6 and 7 for purposes previously explained. The device is then mounted in the package as shown in FIGURE 1 and as previously described.

While the treatment of a single semiconductor device 2 has been described, it will be understood that in practice many such devices may be treated simultaneously, particularly when the devices are formed in a single wafer or body of semiconductor material which is subsequently diced to obtain discrete devices therefrom.

There thus has been described a novel and unexpectedly useful treatment for diffused junction semiconductor devices having oxide layers or layers thereon protecting the surface at which the rectifying junction is terminated and which devices are to be mounted in a package comprising the glass body portion. By processing the devices and/or the body portion of the package, marked stability in the electrical properties of such devices is unexpectedly realized. Specifically, semiconductor devices treated and packaged as described and shown herein are capable of operating for long periods of time without the aforementioned degradation at 50 volts and at temperatures as high as 200° C. As used herein and in the appended claims, the term "semiconductor components" is intended to include (1) completed devices formed of semiconductor materials such as silicon or the like and having at least one PN junction disposed at a surface thereof which is completely covered by an oxide of semiconductor material; (2) or the glass body portions of any packages for such semiconductor device.

What is claimed is:

1. The process of fabricating a semiconductor device comprising the steps of:
   (A) providing a semiconductor body with a layer of an oxide of said semiconductor;
   (B) opening a hole in said oxide layer to expose a portion of said semiconductor body;
   (C) diffusing a conductivity-type-determining impurity through said hole in said oxide layer to establish a diffused region in said semiconductor body forming a rectifying junction therein under said oxide layer;
   (D) closing said hole in said oxide layer;
   (E) heating said semiconductor body to an elevated temperature in the presence of a vapor of material selected from the group consisting essentially of phosphorus pentoxide, arsenic trioxide and phosphorus oxychloride;
   (F) and thereafter providing electrical connections to said device.

2. The process of fabricating a semiconductor device comprising the steps of:
   (A) providing a semiconductor body with a layer of an oxide of said semiconductor;
   (B) opening a hole in said oxide layer to expose a portion of said semiconductor body;
   (C) diffusing a conductivity-type-determining impurity through said hole in said oxide layer to establish a diffused region in said semiconductor body forming a rectifying junction therein under said oxide layer;
   (D) closing said hole in said oxide layer;
   (E) heating said semiconductor body to an elevated temperature in the presence of vapor of material selected from the group consisting essentially of phosphorus pentoxide, arsenic trioxide and phosphorus oxychloride;
   (F) forming a second layer of an oxide of said semiconductor over said first-named oxide layer;
   (G) and thereafter providing electrical connections to said device.

3. The process of treating a semiconductor device and the glass body portion of a container therefor, said semiconductor device having a junction-forming diffused region in at least one surface of a body of semiconductor material and a layer on said surface of an oxide of said semiconductor material, said process comprising the steps of heating said semiconductor device and said glass body portion of said container to an elevated temperature in the presence of a vapor of a material selected from the group consisting essentially of phosphorus pentoxide, arsenic trioxide and phosphorus oxychloride, and thereafter assembling said treated semiconductor device in said container with said treated glass body portion thereof.

4. The invention according to claim 3 wherein an additional layer of said oxide is formed over said first-named oxide layer after said semiconductor device has been heated in the presence of said vapor.

5. The process of fabricating a diffused junction semiconductor device comprising the steps of:
   (A) forming a layer of an oxide having a hole therein on at least one surface of a semiconductor body;
   (B) diffusing a conductivity-type-determining impurity through said hole in said oxide layer to establish a diffused region in said semiconductor body and in rectifying relationship with the undiffused portions thereof;

(C) closing said hole in said oxide layer with additional oxide;

(D) heating said semiconductor body to an elevated temperature in the presence of a vapor of a material selected from the group consisting essentially of phosphorus pentoxide, aresnic trioxide and phosphorus oxychloride;

(E) heating the said glass body portion of a package for said semiconductor body at an elevated temperature in the presence of said vapor prior to mounting said semiconductor body in said package;

(F) and mounting such treated semiconductor body in such treated package therefor.

6. The process of fabricating a diffused junction semiconductor device comprising the steps of:

(A) forming a layer of an oxide having a hole therein on at least one surface of a semiconductor body;

(B) diffusing a conductivity-type-determining impurity through said hole in said oxide layer to establish a diffused region in said semiconductor body and in rectifying relationship with the undiffused portions thereof;

(C) closing said hole in said oxide layer with additional oxide;

(D) heating said semiconductor body to an elevated temperature in the presence of a vapor of a material selected from the group consisting essentially of phosphorus pentoxide, arsenic trioxide and phosphorus oxychloride;

(E) forming an additional layer of said oxide on said first-named oxide layer;

(F) and mounting such treated semiconductor body in an hermetically sealed container therefor.

References Cited

UNITED STATES PATENTS

| | | | |
|---|---|---|---|
| 2,873,222 | 2/1959 | Derick. | |
| 3,212,162 | 10/1965 | Moore | 29—578 |
| 3,247,428 | 4/1966 | Perri. | |
| 3,271,124 | 9/1966 | Clark | 29—588 X |
| 3,289,267 | 12/1966 | Ullrich | 29—578 |
| 3,300,832 | 1/1967 | Cave | 29—580 |
| 2,981,646 | 4/1961 | Robinson. | |

WILLIAM I. BROOKS, *Primary Examiner.*

U.S. Cl. X.R.

29—575, 578, 590; 148—187